(12) United States Patent
Lin et al.

(10) Patent No.: US 9,806,703 B2
(45) Date of Patent: Oct. 31, 2017

(54) SINGLE-ENDED TO DIFFERENTIAL CONVERSION CIRCUIT AND SIGNAL PROCESSING MODULE

(71) Applicant: MediaTek Inc., Hsin-Chu (TW)

(72) Inventors: Yu-Hsin Lin, Taipei (TW); Tze-Chien Wang, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/338,628

(22) Filed: Oct. 31, 2016

(65) Prior Publication Data

US 2017/0070216 A1    Mar. 9, 2017

Related U.S. Application Data

(63) Continuation-in-part of application No. 15/200,045, filed on Jul. 1, 2016.

(60) Provisional application No. 62/214,103, filed on Sep. 3, 2015.

(51) Int. Cl.
*H03L 5/00* (2006.01)
*H03K 5/02* (2006.01)

(52) U.S. Cl.
CPC ........................ *H03K 5/02* (2013.01)

(58) Field of Classification Search
CPC ............................ H03K 5/02; H03K 5/24
USPC ......................................... 327/306
See application file for complete search history.

(56) References Cited

U.S. PATENT DOCUMENTS

| | | | | |
|---|---|---|---|---|
| 4,074,204 A * | 2/1978 | Broburg | ............... | H03F 1/34 330/107 |
| 5,049,831 A | 9/1991 | Westwick | | |
| 5,070,305 A * | 12/1991 | Confalonieri | ........... | H03F 1/303 330/148 |
| 5,614,864 A * | 3/1997 | Stubbe | ............... | H03F 3/45475 330/258 |
| 5,661,423 A * | 8/1997 | Mizuhara | ............... | H03K 5/02 327/307 |
| 6,329,876 B1 * | 12/2001 | Llewellyn | ............... | H03F 1/26 330/69 |
| 6,359,505 B1 | 3/2002 | Joffe | | |

(Continued)

FOREIGN PATENT DOCUMENTS

| | | |
|---|---|---|
| DE | 41 04 714 A1 | 8/1992 |
| WO | WO 89/10656 | 11/1989 |
| WO | WO 00/41297 | 7/2000 |

*Primary Examiner* — Ryan Jager
(74) *Attorney, Agent, or Firm* — McClure, Qualey & Rodack, LLP

(57) ABSTRACT

A single-ended to differential conversion circuit for converting an input signal into a pair of differential signals is provided. An amplifier includes an inverting input terminal, a non-inverting input terminal for receiving a reference signal, and an output terminal. A first resistor is coupled between the inverting input terminal and the output terminal of the amplifier. A second resistor is coupled to the inverting input terminal of the amplifier. The third resistor is coupled to the output terminal of the amplifier. The resistor string is coupled between the output terminal of the amplifier and the second resistor, and includes a fourth resistor and a fifth resistor connected in series. A signal of the pair of differential signals is provided via the third resistor, and another signal of the pair of differential signals is provided via the resistor string.

15 Claims, 2 Drawing Sheets

(56) References Cited

U.S. PATENT DOCUMENTS

| | | | |
|---|---|---|---|
| 8,497,739 B2* | 7/2013 | Koyama | H03F 3/3022 330/104 |
| 8,570,099 B2 | 10/2013 | Ao Ieong et al. | |
| 9,531,341 B2* | 12/2016 | Adams | H03H 7/42 |
| 2007/0205829 A1* | 9/2007 | Kao | H03F 1/223 330/301 |
| 2010/0213985 A1* | 8/2010 | Bell | H03F 3/45179 327/108 |
| 2012/0056668 A1* | 3/2012 | Jordan | H03F 3/45475 327/566 |
| 2012/0056671 A1* | 3/2012 | Jordan | H03F 3/45475 330/252 |
| 2012/0182068 A1* | 7/2012 | Jordan | H03F 3/45959 330/69 |
| 2012/0319767 A1* | 12/2012 | Ao Ieong | H03H 11/32 327/552 |
| 2013/0049857 A1* | 2/2013 | Myles | H03F 1/34 330/69 |

* cited by examiner

SINGLE-ENDED TO DIFFERENTIAL CONVERSION CIRCUIT AND SIGNAL PROCESSING MODULE

CROSS REFERENCE TO RELATED APPLICATIONS

This application is a Continuation-In-Part of pending U.S. patent application Ser. No. 15/200,045, filed Jul. 1, 2016 and entitled "SINGLE-ENDED TO DIFFERENTIAL CONVERSION CIRCUIT AND SIGNAL PROCESSING MODULE", which claims the benefit of Provisional Application No. 62/214,103, filed on Sep. 3, 2015, the entirety of which are incorporated by reference herein.

BACKGROUND OF THE INVENTION

Field of the Invention

The invention relates to a single-ended to differential conversion circuit, and more particularly to a signal processing module with a single-ended to differential conversion circuit for converting an input signal into a pair of differential output signals.

Description of the Related Art

Currently, analog to digital converters (ADCs) are used widely in a variety of applications, such as medical systems, audio systems, test and measurement equipment, communication systems, and image and video systems. In recent years, the differential input ADCs have been used in instrumentation or communications systems. This is because the signal amplitude of a differential input is half that of a single-ended input. Therefore, distortion is decreased and the even-order distortion and the in-phase component noise that are generated by circuits in front of the ADC are canceled by the differential input of the ADC. Thus, it is possible to realize the properties of broad band, low noise, and low distortion.

Therefore, for the performance of the ADC, when the input signals are single-ended signals, it is necessary to set up in front of the ADC a signal converter that converts single-ended signals into differential signals.

BRIEF SUMMARY OF THE INVENTION

A single-ended to differential conversion circuit and a signal processing module are provided. An embodiment of a single-ended to differential conversion circuit for converting an input signal into a pair of differential signals is provided. The single-ended to differential conversion circuit comprises an amplifier, a first resistor, a second resistor, a third resistor and a resistor string. The amplifier comprises an inverting input terminal, a non-inverting input terminal for receiving a reference signal, and an output terminal. The first resistor is coupled between the inverting input terminal and the output terminal of the amplifier. The second resistor is coupled to the inverting input terminal of the amplifier, wherein the inverting input terminal of the amplifier receives the input signal via the second resistor. The third resistor is coupled to the output terminal of the amplifier. The resistor string is coupled between the output terminal of the amplifier and the second resistor, and comprises a fourth resistor and a fifth resistor connected in series. A signal of the pair of differential signals is provided via the third resistor, and another signal of the pair of differential signals is provided via the resistor string.

Furthermore, an embodiment of a signal processing module is provided. The signal processing module comprises a differential signal processing circuit and a single-ended to differential conversion circuit. The differential signal processing circuit providing a pair of differential output signals according to a pair of differential intermediate signals, and comprises a fully-differential amplifier. The single-ended to differential conversion circuit converts an input signal into the pair of differential intermediate signals, and comprises an amplifier, a first resistor, a second resistor, a third resistor, a fourth resistor, and a fifth resistor. The amplifier comprises an inverting input terminal, a non-inverting input terminal for receiving a reference signal, and an output terminal. The first resistor is coupled between the inverting input terminal and the output terminal of the amplifier. The second resistor is coupled to the inverting input terminal of the amplifier, wherein the inverting input terminal of the amplifier receives the input signal via the second resistor. The third resistor is coupled between the output terminal of the amplifier and a non-inverting input terminal of the fully-differential amplifier. The fourth resistor is coupled between the output terminal of the amplifier and an inverting input terminal of the fully-differential amplifier. The fifth resistor is coupled between the second resistor and the inverting input terminal of the fully-differential amplifier.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
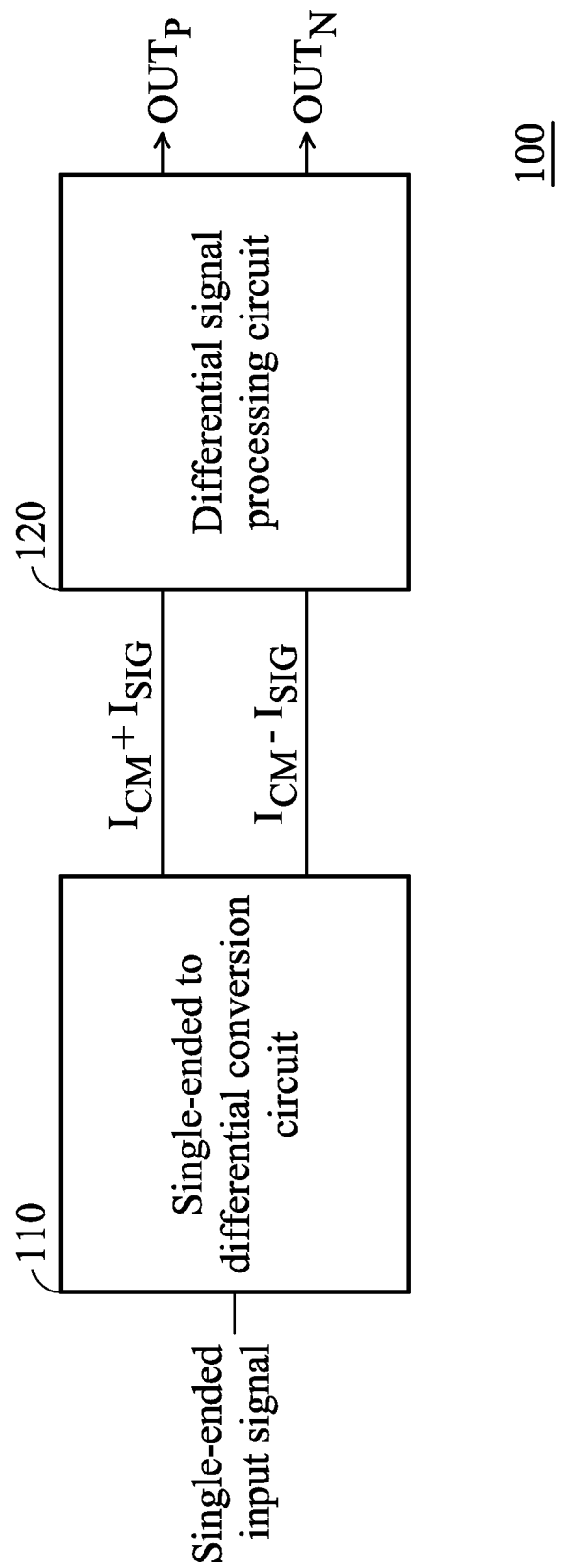
FIG. 1 shows a signal processing module according to an embodiment of the invention.

FIG. 1 shows a signal processing module 100 according to an embodiment of the invention. The signal processing module 100 comprises a single-ended to differential conversion circuit 110 and a differential signal processing circuit 120. The single-ended to differential conversion circuit 110 is capable of converting a single-ended input signal into a pair of intermediate signals (labeled as the differential current signals $I_{CM}+I_{SIG}$ and $I_{CM}-I_{SIG}$, wherein $I_{CM}$ represents the DC component and $I_{SIG}$ represents the AC component). In some embodiments, the pair of intermediate signals may be the voltage signals, and the single-ended to differential conversion circuit 110 is capable of converting the single-ended input signal into the voltages (e.g. the differential voltage signals $V_{CM}+V_{SIG}$ and $V_{CM}-V_{SIG}$) corresponding to the pair of intermediate signals. The differential signal processing circuit 120 is capable of processing the pair of intermediate signals and providing a pair of differential output signals $OUT_P/OUT_N$ according to the pair of intermediate signals (e.g. $I_{CM}+I_{SIG}$ and $I_{CM}-I_{SIG}$). For example, in some embodiments, the differential signal processing circuit 120 amplifies the pair of intermediate signals (e.g. $I_{CM}+I_{SIG}$ and $I_{CM}-I_{SIG}$) to obtain the pair of differential output signals $OUT_P/OUTN$. As another example, in some embodiments, the differential signal processing circuit 120 modifies the pair of intermediate signals (e.g. $I_{CM}+I_{SIG}$, $I_{CM}-I_{SIG}$) according to a modification signal (not shown) to obtain the pair of differential output signals $OUT_P/OUT_N$. It should be noted that the operation of the differential signal processing circuit 120 is used as an example, and not to limit the invention.

Figure 2:
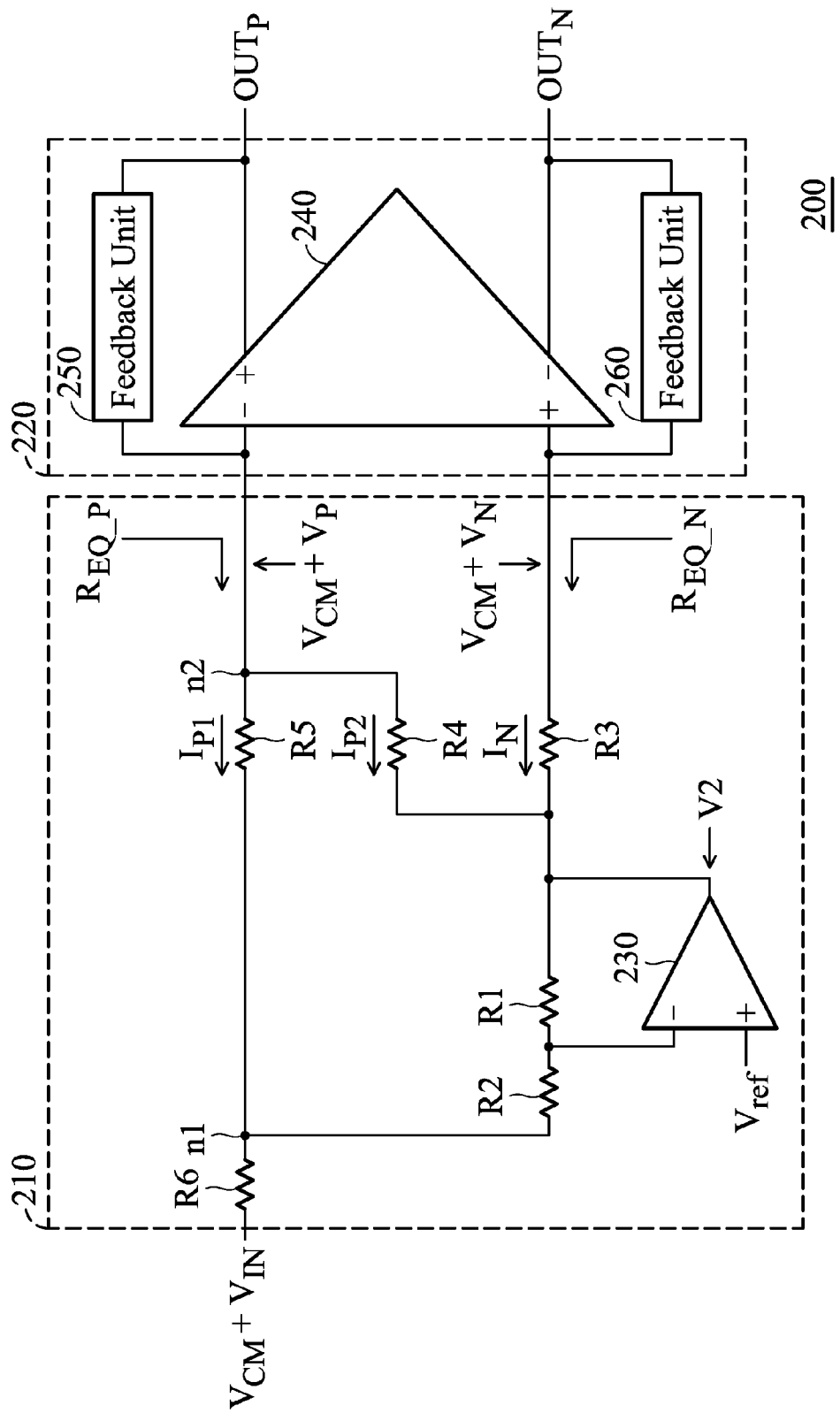
FIG. 2 shows a signal processing module according to another embodiment of the invention.

FIG. 2 shows a signal processing module 200 according to another embodiment of the invention. The signal processing module 200 comprises a single-ended to differential conversion circuit 210 and a differential signal processing circuit 220. The single-ended to differential conversion circuit 210 is capable of converting a single-ended input signal $V_{CM}+V_{IN}$ into a pair of differential intermediate signals. In the embodiment, the pair of differential intermediate signals are a pair of differential current signals (e.g. the current $(I_{P1}+I_{P2})$ at the node n2 and the current—$I_N$ at the node n3 in FIG. 2). It should be noted that, $V_{CM}$ may represent a DC voltage, and $V_{IN}$ may represent an AC component containing the AC voltage. For example, when $V_{CM}=0V$, $V_{IN}$ can be used to represent a pure AC signal without a DC component. Of course, $V_{IN}$ can also be used to represent an AC signal with a DC component. In particular, the embodiments are used as the examples, and not to limit the invention. In the embodiment, the single-ended to differential conversion circuit 210 comprises an amplifier 230 (as shown in FIG. 2, the amplifier 230 is a single-ended amplifier), and six resistors R1-R6. In some embodiments, the resistor R6 could be omitted. In other words, the resistor R6 is optional. The differential signal processing circuit 220 comprises a fully-differential amplifier 240, and two feedback units 250 and 260. The feedback unit 250 is coupled between an inverting input terminal and a non-inverting output terminal of the fully-differential amplifier 240, and the feedback unit 260 is coupled between a non-inverting input terminal and an inverting output terminal of the fully-differential amplifier 240. In some embodiments, the differential signal processing circuit 220 further comprises two input units (not shown), wherein one input unit is coupled between the inverting input terminal of the fully-differential amplifier 240 and a node n2 of the single-ended to differential conversion circuit 210 (for example, between one differential output terminal of the single-ended to differential conversion circuit 210 and the inverting input terminal of the fully-differential amplifier 240), and another input unit is coupled between the non-inverting input terminal of the fully-differential amplifier 240 and the resistor R3 of the single-ended to differential conversion circuit 210 (for example, between the other differential output terminal of the single-ended to differential conversion circuit 210 and the non-inverting input terminal of the fully-differential amplifier 240). Thus, a gain is determined according to the input units and the feedback units 250 and 260 for the fully-differential amplifier 240. In practice, if the fully-differential amplifier 240 is an ideal amplifier, the input voltages of its inverting input terminal and its non-inverting input terminal are equal. If the fully-differential amplifier 240 is a non-ideal amplifier, the input voltages of its inverting input terminal and its non-inverting input terminal are the differential voltages. In the embodiment, no matter whether the fully-differential amplifier 240 is an ideal amplifier, the two input currents of the fully-differential amplifier 240 are the differential currents. Therefore, in the embodiment, for the convenience of explanation, the differential intermediate signals are the differential current signals, and the fully-differential amplifier 240 is an ideal amplifier 240.

It should be noted that the specific type of the fully-differential amplifier 240 is used as an example, and not to limit the invention. The reason is that, for a particular type of fully-differential amplifier 240, the fully-differential amplifier 240 will automatically adjust the voltages of its input terminals, such that the voltages of the input terminals can meet the objective requests of the particular type of fully-differential amplifier. In the embodiment, for the convenience of description, the voltages of two input terminals of the fully-differential amplifier 240 are maintained at the voltage $V_{CM}$ (i.e. the voltage $V_{n2}$ of the node n2 and the voltage $V_{n3}$ of the node n3 are equal to the voltage $V_{CM}$, e.g. $V_{n2}=V_{n3}=V_{CM}$), and it should be noted that the invention is not limited thereto.

In the single-ended to differential conversion circuit 210 of FIG. 2, the amplifier 230 has an inverting input terminal coupled to a terminal of the resistor R1 and a terminal of the resistor R2, a non-inverting input terminal for receiving a reference signal $V_{ref}$ and an output terminal coupled to another terminal of the resistor R1, a terminal of the resistor R3, and a terminal of the resistor R4. In some embodiments, the reference signal $V_{ref}$ has a constant voltage value. For example, the voltage level of the reference signal $V_{ref}$ is equal to that of the DC voltage $V_{CM}$. For convenience of description, the reference signal $V_{ref}$ is equal to that the DC voltage $V_{CM}$ in the embodiment, and it should be noted that the invention is not limited to this. Because, if the voltage level of the DC voltage $V_{CM}$ is not equal to that of the reference signal $V_{ref}$, V can be replaced by $(V_{CM}-V_{ref}+V_{IN})$. Thus, based on the following embodiments, the resistance value of the resistor R3, and the equivalent impedance of the single-ended to differential conversion circuit 210 can be obtained accordingly. The resistor R6 is coupled to a node n1, and the resistor R6 is an input resistor for receiving the input signal $V_{IN}$. The resistor R2 is coupled between the node n1 and the inverting input terminal of the amplifier 230, and the inverting input terminal of the amplifier 230 can receive the input signal $V_{IN}$ via the resistor R2. The resistor R1 is coupled between the inverting input terminal and the output terminal of the amplifier 230. The resistor R3 is coupled between the output terminal of the amplifier 230 and the non-inverting input terminal of the fully-differential amplifier 240. The resistor R4 is coupled between the output terminal of the amplifier 230 and the node n2. The resistor R5 is coupled between the node n2 and the node n1. Furthermore, the resistors R4 and R5 form a resistor string coupled between the node n1 and the output terminal of the amplifier 230. In some embodiments, the resistance value of the resistor R3 is determined according to the resistors R1, R2, R4 and R5.

In one embodiment, the resistance (or impedance) of the resistor R5 is R, which is a unit resistance for the single-ended to differential conversion circuit 210. The resistance of the resistor R6 is m×R. The resistance of the resistor R2 is x×R. The resistance of the resistor R1 is y×R. The resistance of the resistor R4 is n×R. According to the resistances of the resistors R1, R2, R4 and R5, the resistance of the resistor R3 is obtained according to the following formula (1):

$$R3 = \frac{\frac{y}{x}}{1-\frac{y}{x}\frac{1}{n}} \times R. \tag{1}$$

Furthermore, according to a virtual ground concept of circuit analysis in operational amplifier, the nodes at the non-inverting input terminal and inverting input terminal of the amplifier 230, and the nodes at the non-inverting input terminal and inverting input terminal of the fully-differential amplifier 240 are maintained at a steady reference potential (i.e. a virtual ground). Thus, a voltage $V_{n1}$ at the node n1 is obtained according to the following formula (2):

$$V_{n1} = V_{CM} + V1 = V_{CM} + \frac{\frac{x}{1+x}}{m + \frac{x}{1+x}} \times V_{IN}, \tag{2}$$

wherein $$V1 + \frac{\frac{x}{1+x}}{m + \frac{x}{1+x}} \times V_{IN}.$$

Furthermore, according to the voltage $V_{n1}$ at the node n1, and the resistors R1 and R2, a voltage V2 at the output terminal of the amplifier 230 is obtained according to the following formula (3):

$$V2 = V_{CM} - \frac{y}{x} \times V1. \tag{3}$$

According to the voltages $V_{n1}$, $V_{n2}$ and V2, the current $I_{p1}$ flowing through the resistor R5, the current $I_{p2}$ flowing through the resistor R4, and current $I_N$ flowing through the resistor R3 are respectively obtained according to the following formulas (4)-(6):

$$I_{P1} = -\frac{V_1}{R}; \tag{4}$$

$$I_{P2} = \frac{\frac{y}{x} \times V1}{n \cdot R}; \text{ and} \tag{5}$$

$$I_N = \frac{\frac{y}{x} \times V1}{\frac{y}{x} \times R} = \left(1 - \frac{y}{n} \cdot \frac{1}{n}\right) \times \frac{V_1}{R} = -(I_{P1} + I_{P2}). \tag{6}$$

From the formulas (4) - (6), by appropriately setting the resistance value of the resistor R3, the output currents of the single-ended to differential conversion circuit 210 are always a pair of differential signals based on the architecture shown in FIG. 2, i.e. $I_N=-(I_{P1}+I_{P2})$. Furthermore, by determining the relationship between the voltage/current of the inverting input terminal and the voltage/current of the non-inverting input terminal of the fully-differential amplifier 240, a common mode or a differential mode is determined for the signal processing module 200, so as to estimate the common mode or differential mode perturbations for the pair of intermediate signals, and then the equivalent impedance $R_{EQ\_P}$ observed at the inverting input terminal of the fully-differential amplifier 240 (in other words, observing the single-ended to differential conversion circuit 210 from the inverting input terminal of the fully-differential amplifier 240) and the equivalent impedance $R_{EQ\_N}$ observed at the non-inverting input terminal of the fully-differential amplifier 240 are obtained (in other words, observing the single-ended to differential conversion circuit 210 from the non-inverting input terminal of the fully-differential amplifier 240). In some embodiments, the equivalent impedances $R_{EQ\_P}$ and $R_{EQ\_N}$ may be set to the same. In some embodiments, the equivalent impedances $R_{EQ\_P}$ and $R_{EQ\_N}$ are the output impedances for the single-ended to differential conversion circuit 210.

In order to calculate the output impedances, the voltages $V_{CM}+V_P$ and $V_{CM}+V_N$ are applied to the output terminals of the single-ended to differential conversion circuit 210, without receiving the single-ended input signal at its input terminal. For example, in order to calculate the common mode output impedances of the single-ended to differential conversion circuit 210), the voltage $V_{CM}+V_P$ applied to the inverting input terminal and the voltage $V_{CM}+V_N$ applied to the non-inverting input terminal of the fully-differential amplifier 240 are assumed to be the same, i.e. $V_P=V_P=V_N$. Furthermore, in a common mode, if the equivalent impedances $R_{EQ\_P}$ and $R_{EQ\_N}$ are equal, a current from the inverting input terminal of the fully-differential amplifier 240 to the single-ended to differential conversion circuit 210 is equal to a current from the non-inverting input terminal of the fully-differential amplifier 240 to the single-ended to differential conversion circuit 210, i.e. $I_{P1}+I_{P2}=I_N$. Thus, the equivalent impedances $R_{EQ\_P}$ and $R_{EQ\_N}$ are obtained according to the following formulas (7)-(8):

$$R_{EQ\_P} = \frac{1}{1+\frac{m \cdot x}{m+x}} + \frac{1}{n}\left(1 + \frac{y}{x} \cdot \frac{\frac{m \cdot x}{m+x}}{1+\frac{m \cdot x}{m+x}}\right); \text{ and} \tag{7}$$

$$R_{EQ\_N} = \frac{1 + \frac{y}{x} \cdot \frac{\frac{m \cdot x}{m+x}}{1+\frac{m \cdot x}{m+x}}}{\frac{y}{x}}. \tag{8}$$

When $$\frac{1}{1+\frac{m \cdot x}{m+x}} + \frac{1}{n}\left(1 + \frac{y}{x} \cdot \frac{\frac{m \cdot x}{m+x}}{1+\frac{m \cdot x}{m+x}}\right) = \frac{1 + \frac{y}{x} \cdot \frac{\frac{m \cdot x}{m+x}}{1+\frac{m \cdot x}{m+x}}}{\frac{y}{x}}$$

is satisfied, the equivalent impedances $R_{EQ\_P}$ and $R_{EQ\_N}$ are the same in the common mode.

Correspondingly, in order to calculate the differential mode output impedances of the single-ended to differential conversion circuit 210, the voltage $V_{CM}+V_P$ applied to the inverting input terminal and the voltage $V_{CM}+V_N$ applied to the non-inverting input terminal of the fully-differential amplifier 240 are the differential signals, e.g. $V_P=-V_N$. Furthermore, in a differential mode, if the equivalent impedances $R_{EQ\_P}$ and $R_{EQ\_N}$ are equal, a current from the single-ended to differential conversion circuit 210 to the inverting input terminal of the fully-differential amplifier 240 is equal to a current from the non-inverting input terminal of the fully-differential amplifier 240 to the single-ended to differential conversion circuit 210, i.e. $I_{P1}+I_{P2}=-I_N$. Thus, the equivalent impedances $R_{EQ\_P}$ and $R_{EQ\_N}$ are obtained according to the following formulas (9)-(10):

$$R_{EQ\_P} = \frac{1}{1+m\|x} + \frac{1}{n}\left(1+\frac{y}{x}\frac{m\|x}{1+m\|x}\right); \text{ and} \quad (9)$$

$$R_{EQ\_N} = \frac{1-\frac{y}{x}\frac{m\|x}{1+m\|x}}{\frac{y}{x}}. \quad (10)$$

$$\frac{\frac{y}{1-\frac{y}{x}\frac{1}{n}}}$$

When $$\frac{1}{1+\frac{m\cdot x}{m+x}} + \frac{1}{n}\left(1+\frac{y}{x}\cdot\frac{\frac{m\cdot x}{m+x}}{1+\frac{m\cdot x}{m+x}}\right) = \frac{1-\frac{y}{x}\cdot\frac{\frac{m\cdot x}{m+x}}{1+\frac{m\cdot x}{m+x}}}{\frac{\frac{y}{x}}{1-\frac{y}{x}\cdot\frac{1}{n}}}$$

When is satisfied, the equivalent impedances $R_{EQ\_P}$ and $R_{EQ\_N}$ are the same in the differential mode.

It should be noted that if the common-mode output impedances or the differential mode output impedances are respectively equal, the absolute value of the sum of the currents I1 and I2 is equal to the absolute value of the current I3, i.e. $|I_{P1}+I_{P2}|=|I_N|$. Furthermore, according to actual application, the equivalent impedances $R_{EQ\_P}$ and $R_{EQ\_N}$ can be obtained for a common mode or a differential mode perturbation. Typically, it can not meet that the common-mode equivalent impedances and the differential-mode equivalent impedances are respectively equal. Specifically, according to actual requirements, it is possible to set that the common-mode equivalent impedances are equal or the differential-mode equivalent impedances are equal, and the invention does not make this any limitation. For example, since the circuit (e.g. the single-ended to differential conversion circuit 110) disposed in front of the differential signal processing circuit 120 usually has a common-mode noise, the common-mode noise can be cancelled between the two differential input terminals of the fully-differential amplifier 240 by setting the equivalent impedances $R_{EQ\_P}$ and $R_{EQ\_N}$ are the same in the common mode, thereby decreasing noise. For another example, by setting the equivalent impedances $R_{EQ\_P}$ and $R_{EQ\_N}$ are the same in the differential mode, distortion is decreased in the applications with a differential mode feedback.

By adding the resistor R4 between the node n2 and the output terminal of the amplifier 230, only a single single-ended amplifier (i.e. the amplifier 230) is used in the single-ended to differential conversion circuit 210. Thus, compared with the conventional single-ended to differential conversion circuits (e.g. using two single-ended amplifiers solution, or a fully-differential amplifier solution, and so on), the layout area and the power consumption are decreased in the single-ended to differential conversion circuit 210. Furthermore, trade-off between the input magnitude of the single-ended input signal and the performance of the amplifier 230 can be optimized. With the introduction of the resistor R4 (e.g. a resistance of n×R), the equivalent input is scaled by 1-1/n (n>1), and the non-idealities of the amplifier 230 can be cancelled to be $|1/n-(1(y/x)\times(1/n))/(y/x)|$. For example, assuming that the resistors R1 and R2 are equal to the resistor R5 (i.e. x=y=1) and the resistor R4 is twice as big as the resistor R5 (i.e. n=2), the noise and distortion caused by the amplifier 230 can be cancelled completely. Specifically, the noise and distortion caused by the amplifier 230 can be decreased by appropriately controlling the ratio of the resistors R1, R2, R4 and R5. It should be noted that, x, y, m and n of the embodiments are not limited to an integer.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A single-ended to differential conversion circuit for converting an input signal into a pair of differential signals, comprising:
   an amplifier, comprising an inverting input terminal, a non-inverting input terminal for receiving a reference signal, and an output terminal;
   a first resistor coupled between the inverting input terminal and the output terminal of the amplifier;
   a second resistor coupled to the inverting input terminal of the amplifier, wherein the inverting input terminal of the amplifier receives the input signal via the second resistor;
   a third resistor coupled to the output terminal of the amplifier; and
   a resistor string coupled between the output terminal of the amplifier and the second resistor, comprising a fourth resistor and a fifth resistor connected in series,
   wherein a signal of the pair of differential signals is provided via the third resistor, and another signal of the pair of differential signals is provided via the resistor string.

2. The single-ended to differential conversion circuit as claimed in claim 1, further comprising:
   a sixth resistor coupled to the second resistor and the resistor string, receiving the input signal,
   wherein the second resistor is coupled between the sixth resistor and the inverting input terminal of the amplifier, and the fifth resistor is coupled between the sixth resistor and the fourth resistor.

3. The single-ended to differential conversion circuit as claimed in claim 1, wherein the sum of a first current flowing through the fifth resistor and a second current flowing through the fourth resistor is equal to a third current flowing through the third resistor.

4. The single-ended to differential conversion circuit as claimed in claim 1, wherein common mode output impedances of the single-ended to differential conversion circuit are equal.

5. The single-ended to differential conversion circuit as claimed in claim 1, wherein differential mode output impedances of the single-ended to differential conversion circuit are equal.

6. The single-ended to differential conversion circuit as claimed in claim 1, wherein the resistance of the fifth resistor is R, the resistance of the fourth resistor is n×R, the resistance of the second resistor is x×R, the resistance of the first resistor is y×R, and the resistance of the third resistor is $$\frac{\frac{y}{x}}{1-\frac{y}{x}\frac{1}{n}} \times R.$$

7. The single-ended to differential conversion circuit as claimed in claim 1, wherein the reference signal has a constant voltage value.

8. A signal processing module, comprising:
a differential signal processing circuit, providing a pair of differential output signals according to a pair of differential intermediate signals, comprising:
a fully-differential amplifier; and
a single-ended to differential conversion circuit, converting an input signal into the pair of differential intermediate signals, and comprising:
an amplifier, comprising an inverting input terminal, a non-inverting input terminal for receiving a reference signal, and an output terminal;
a first resistor coupled between the inverting input terminal and the output terminal of the amplifier;
a second resistor coupled to the inverting input terminal of the amplifier, wherein the inverting input terminal of the amplifier receives the input signal via the second resistor;
a third resistor coupled between the output terminal of the amplifier and a non-inverting input terminal of the fully-differential amplifier;
a fourth resistor coupled between the output terminal of the amplifier and an inverting input terminal of the fully-differential amplifier; and
a fifth resistor coupled between the second resistor and the inverting input terminal of the fully-differential amplifier.

9. The signal processing module as claimed in claim 8, wherein an intermediate signal of the pair of differential intermediate signals is provided to the non-inverting input terminal of the fully-differential amplifier via the third resistor, and another intermediate signal of the pair of differential output signals is provided to the inverting input terminal of the fully-differential amplifier via the fourth and fifth resistors.

10. The signal processing module as claimed in claim 8, wherein the single-ended to differential conversion circuit further comprises:
a sixth resistor coupled to the second resistor and the fifth resistor, receiving the input signal,
wherein the second resistor is coupled between the sixth resistor and the inverting input terminal of the amplifier, and the fifth resistor is coupled between the sixth resistor and the fourth resistor.

11. The signal processing module as claimed in claim 8, wherein the sum of a first current flowing through the fifth resistor and a second current flowing through the fourth resistor is equal to a third current flowing through the third resistor.

12. The signal processing module as claimed in claim 8, wherein common mode output impedances of the single-ended to differential conversion circuit are equal.

13. The signal processing module as claimed in claim 8, wherein differential mode output impedances of the single-ended to differential conversion circuit are equal.

14. The signal processing module as claimed in claim 8, wherein the resistance of the fifth resistor is R, the resistance of the fourth resistor is n×R, the resistance of the second resistor is x×R, the resistance of the first resistor is y×R, and the resistance of the third resistor is $$\frac{\frac{y}{x}}{1-\frac{y}{x}\frac{1}{n}} \times R.$$

15. The signal processing module as claimed in claim 8, wherein the reference signal has a constant voltage value.

* * * * *